US009970967B2

(12) United States Patent
Kreiner et al.

(10) Patent No.: US 9,970,967 B2
(45) Date of Patent: May 15, 2018

(54) METHODS, SYSTEMS, AND PRODUCTS FOR POWER MANAGEMENT IN CABLE ASSEMBLIES

(71) Applicant: AT&T Intellectual Property I, L.P., Atlanta, GA (US)

(72) Inventors: Barrett M. Kreiner, Woodstock, GA (US); Jonathan L. Reeves, Roswell, GA (US)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 0 days. days.

(21) Appl. No.: 15/480,602

(22) Filed: Apr. 6, 2017

(65) Prior Publication Data
US 2017/0212159 A1 Jul. 27, 2017

Related U.S. Application Data

(63) Continuation of application No. 14/463,744, filed on Aug. 20, 2014, now Pat. No. 9,645,183.

(51) Int. Cl.
G08B 21/00 (2006.01)
G01R 21/133 (2006.01)
G01R 19/165 (2006.01)
G01R 31/02 (2006.01)

(52) U.S. Cl.
CPC ......... *G01R 21/133* (2013.01); *G01R 19/165* (2013.01); *G01R 31/021* (2013.01)

(58) Field of Classification Search
None
See application file for complete search history.

(56) References Cited

U.S. PATENT DOCUMENTS

| | | | | |
|---|---|---|---|---|
| 4,450,023 A | * | 5/1984 | De Blauwe | C09D 11/50 116/201 |
| 4,730,156 A | * | 3/1988 | Matsuda | G06F 11/0754 324/750.3 |
| 5,771,471 A | * | 6/1998 | Alberth, Jr. | H02J 7/0068 363/8 |
| 5,922,996 A | | 7/1999 | Ryeczek | |
| 6,049,143 A | * | 4/2000 | Simpson | H01R 13/7039 307/126 |
| 6,211,808 B1 | * | 4/2001 | Rees | G01S 7/04 342/27 |
| 6,596,943 B1 | | 7/2003 | Ward | |
| 6,646,206 B2 | | 11/2003 | Ryeczek | |
| 6,960,725 B2 | | 11/2005 | Zhengkai et al. | |
| 7,058,484 B1 | * | 6/2006 | Potega | G06F 1/26 320/134 |
| 7,113,102 B2 | * | 9/2006 | Soemantri | G09G 5/003 323/282 |
| 7,278,369 B2 | | 10/2007 | Kelley et al. | |

(Continued)

FOREIGN PATENT DOCUMENTS

FR 2967258 5/2012

*Primary Examiner* — Julie Lieu
(74) *Attorney, Agent, or Firm* — Scott P. Zimmerman, PLLC

(57) ABSTRACT

Cable assemblies react to electrical power. A visual indicator in a cable assembly changes color in response to the electrical power. The visual indicator, for example, may respond to heat or electromagnetic field in the cable assembly. In smart cables, a controller may activate the visual indicator in response to the electrical power applied to the cable.

19 Claims, 28 Drawing Sheets

(56) References Cited

U.S. PATENT DOCUMENTS

| | | | | |
|---|---|---|---|---|
| 7,421,290 B2* | 9/2008 | Lehr | ............ | G05F 1/66 |
| | | | | 340/12.32 |
| RE41,593 E * | 8/2010 | Ryeczek | ............ | G01K 11/12 |
| | | | | 174/112 |
| 8,086,781 B2 | 12/2011 | Ananny et al. | | |
| 8,161,567 B2* | 4/2012 | Rubinstein | ............ | G06F 21/445 |
| | | | | 726/34 |
| 8,200,881 B2 | 6/2012 | Lydon et al. | | |
| 8,239,605 B2 | 8/2012 | Lydon et al. | | |
| 8,245,041 B2 | 8/2012 | Shankar et al. | | |
| 2002/0170739 A1 | 11/2002 | Ryeczek | | |
| 2003/0212836 A1* | 11/2003 | Rommelmann | ............ | G06F 1/28 |
| | | | | 710/1 |
| 2004/0010649 A1* | 1/2004 | Weaver | ............ | H02J 9/00 |
| | | | | 710/302 |
| 2008/0121171 A1* | 5/2008 | Hulsey | ............ | G01K 11/12 |
| | | | | 116/216 |
| 2009/0102442 A1* | 4/2009 | Lai | ............ | G06F 1/266 |
| | | | | 323/281 |
| 2009/0135732 A1* | 5/2009 | Maxson | ............ | H04L 43/50 |
| | | | | 370/252 |
| 2011/0068801 A1* | 3/2011 | Lenzie | ............ | G01R 31/025 |
| | | | | 324/508 |
| 2011/0239008 A1* | 9/2011 | Lam | ............ | G06F 13/409 |
| | | | | 713/300 |
| 2012/0062385 A1* | 3/2012 | Wiesemann | ............ | B60L 3/0069 |
| | | | | 340/635 |
| 2013/0012774 A1* | 1/2013 | Koide | ............ | A61B 1/041 |
| | | | | 600/109 |
| 2015/0327856 A1* | 11/2015 | Milliman | ............ | A61B 1/31 |
| | | | | 606/219 |
| 2015/0346792 A1* | 12/2015 | Rathi | ............ | G06F 1/266 |
| | | | | 713/310 |
| 2015/0377947 A1* | 12/2015 | Hai | ............ | G01R 19/2506 |
| | | | | 324/750.01 |
| 2016/0094061 A1* | 3/2016 | Terlizzi | ............ | H02J 7/0004 |
| | | | | 320/106 |
| 2016/0140372 A1* | 5/2016 | Deal | ............ | G06K 7/10821 |
| | | | | 235/462.15 |
| 2016/0379028 A1* | 12/2016 | Pierce | ............ | G06K 7/10821 |
| | | | | 726/16 |

* cited by examiner

METHODS, SYSTEMS, AND PRODUCTS FOR POWER MANAGEMENT IN CABLE ASSEMBLIES

CROSS-REFERENCE TO RELATED APPLICATION

This application is a continuation of U.S. application Ser. No. 14/463,744 filed Aug. 20, 2014 and since issued as U.S. Pat. No. 9,645,183, and incorporated herein by reference in its entirety.

BACKGROUND

Conductive cables are common in today's communications environment. Cables connect networked devices in homes and businesses. Cables also transfer electrical power from electrical outlets and chargers. Unfortunately, a cable may also transfer unexpected electrical potential between devices, thus damaging the cable itself and perhaps the connected devices.

BRIEF DESCRIPTION OF THE SEVERAL VIEWS OF THE DRAWINGS

The features, aspects, and advantages of the exemplary embodiments are better understood when the following Detailed Description is read with reference to the accompanying drawings, wherein.

DETAILED DESCRIPTION

The exemplary embodiments will now be described more fully hereinafter with reference to the accompanying drawings. The exemplary embodiments may, however, be embodied in many different forms and should not be construed as limited to the embodiments set forth herein. These embodiments are provided so that this disclosure will be thorough and complete and will fully convey the exemplary embodiments to those of ordinary skill in the art. Moreover, all statements herein reciting embodiments, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating the exemplary embodiments. The functions of the various elements shown in the figures may be provided through the use of dedicated hardware as well as hardware capable of executing associated software. Those of ordinary skill in the art further understand that the exemplary hardware, software, processes, methods, and/or operating systems described herein are for illustrative purposes and, thus, are not intended to be limited to any particular named manufacturer.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

It will also be understood that, although the terms first, second, etc. may be used herein to describe various elements, these elements should not be limited by these terms. These terms are only used to distinguish one element from another. For example, a first device could be termed a second device, and, similarly, a second device could be termed a first device without departing from the teachings of the disclosure.

Figure 1:
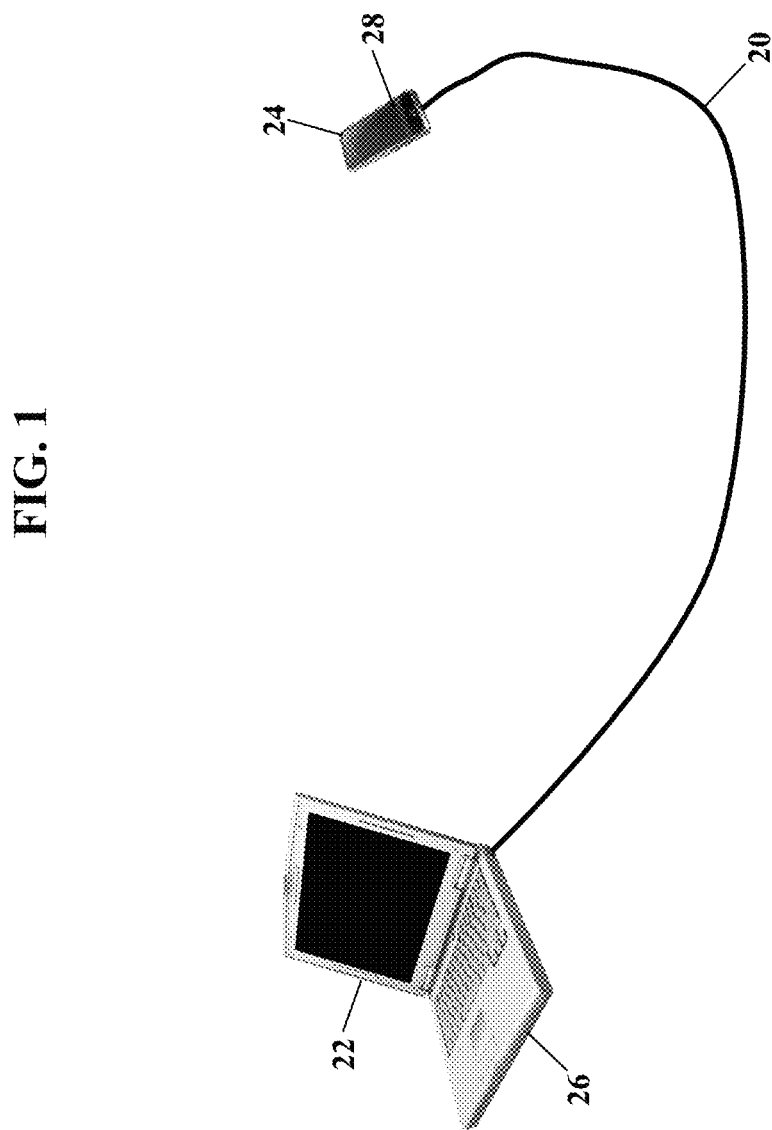
FIGS. 1-2 are simplified schematics illustrating an environment in which exemplary embodiments may be implemented.
Figure 2:
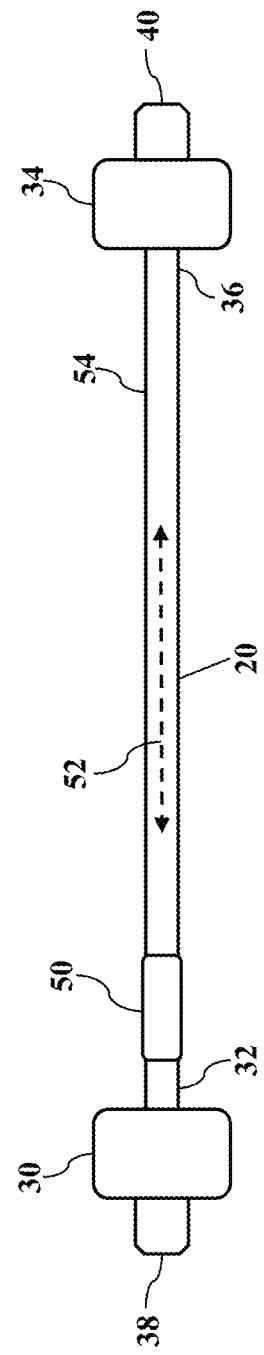

FIGS. 1-2 are simplified schematics illustrating an environment in which exemplary embodiments may be implemented. FIG. 1 illustrates a cable assembly 20 interconnecting two devices 22 and 24. The devices 22 and 24, for simplicity, are illustrated as a mobile, laptop computer 26 and a mobile smartphone 28. The devices 22 and 24, though, may be any host and accessory pairing between computing systems. The devices 22 and 24, for example, may be any peripheral device, router, switch, gateway, tablet, computer, or any other processor- or non-processor-controlled system. Regardless, as FIG. 2 illustrates, the cable assembly 20 has a first head 30 at one end 32 and a second head 34 at an opposite end 36. The cable assembly 20 has internal metallic or other conductive conductors, which are well known and not shown for simplicity. The cable assembly 20 may even have a hybrid design, including both conductive and optical fibers, which are also known and not shown for simplicity. The first head 30 has a first connector 38, while the second head 34 has a corresponding second connector 40. The first connector 38 and the second connector 40 may have the same, or different, physical interfaces (such as USB®, FIREWIRE®, LIGHTNING®, and/or DISPLAYPORT® connectors). As there are many known cable assemblies, this disclosure need not discuss the known features in detail. Indeed, as the cable assembly 20 is generally well known, its known details need not be further explained.

FIG. 2, though, illustrates a visual indicator 50. The visual indicator 50 provides confirmation that some damage has occurred to the cable assembly 20. As the reader may understand, the cable assembly 20 may transfer electrical power 52 along its internal conductors and/or optical fibers. The cable assembly 20 may only be rated for a specific voltage and amperage, or perhaps a range of voltages and currents. Nonetheless, the cable assembly 20 may be subjected or exposed to excessive voltage and/or current due to incorrect connections, shorts, overloading, external power spikes (such as lightning strikes), and many other causes. Any excessive electrical power 52 may physically damage the cable assembly 20, such as scorching, melting, or other physical change.

The visual indicator 50 reveals the damage. The visual indicator 50 may change in some way when heat, voltage, and/or current is generated by excessive electrical power 52. FIG. 2 illustrates the visual indicator 50 applied to an outer sheath or insulator 54 of the cable assembly 20. The visual indicator 50 changes its visual appearance whenever the cable assembly 20 experiences the excessive electrical power 52. The visual indicator 50, for example, may have a green color for a fifteen Amp (15 A) rating, thus visually indicating that the cable assembly 20 is operating within its permissible current range. However, a thirty Amp (30 A) current may cause the visual indicator 50 to drastically change color (perhaps to red or black), thus temporarily or permanently indicating the excessive electrical power 52. Even a pinch or fold in the cable assembly 20 may change its electrical resistance, so the visual indicator 50 may indicate physical damage in a specific region of the cable assembly 20. The visual indicator 50 thus reveals excessive current and/or voltage within the cable assembly 20.

The visual indicator 50 may be applied to any cable. The ability to identify the excessive electrical power 52 helps reduce or avoid data interruptions and even catastrophic failures (such as fire hazards). The visual indicator 50 may be applied to data cables, power cables, extension cords, power bars, and even electrical outlets. For example, the visual indicator 50 may indicate potential failures in ETHERNET®, coaxial cables, and charging cords. For example, the visual indicator 50 may be applied to any "Power over Ethernet" cable in which electrical power and data are conveyed Ethernet cabling. Electrical power may be carried on the same conductors as the data, or electrical power may be carried on dedicated conductors in the cable assembly 20. The visual indicator 50 may even be added to an Ethernet cable that is "repurposed" to a "Power over Ethernet" cable.

The visual indicator 50 may have any composition. For example, the visual indicator 50 may include any thermochromic material that is applied to, or molded into, the outer sheath or insulator 54 of the cable assembly 20. Thermochromic materials are known to change color when subjected to heat. The visual indicator 50 may additionally or alternatively include any electrorheological/magnetorheological material or fluid that changes color in the presence of an electrical/magnetic field. The visual indicator 50 may even be processor controlled to emit visible light, as later paragraphs will explain.

Figure 3:
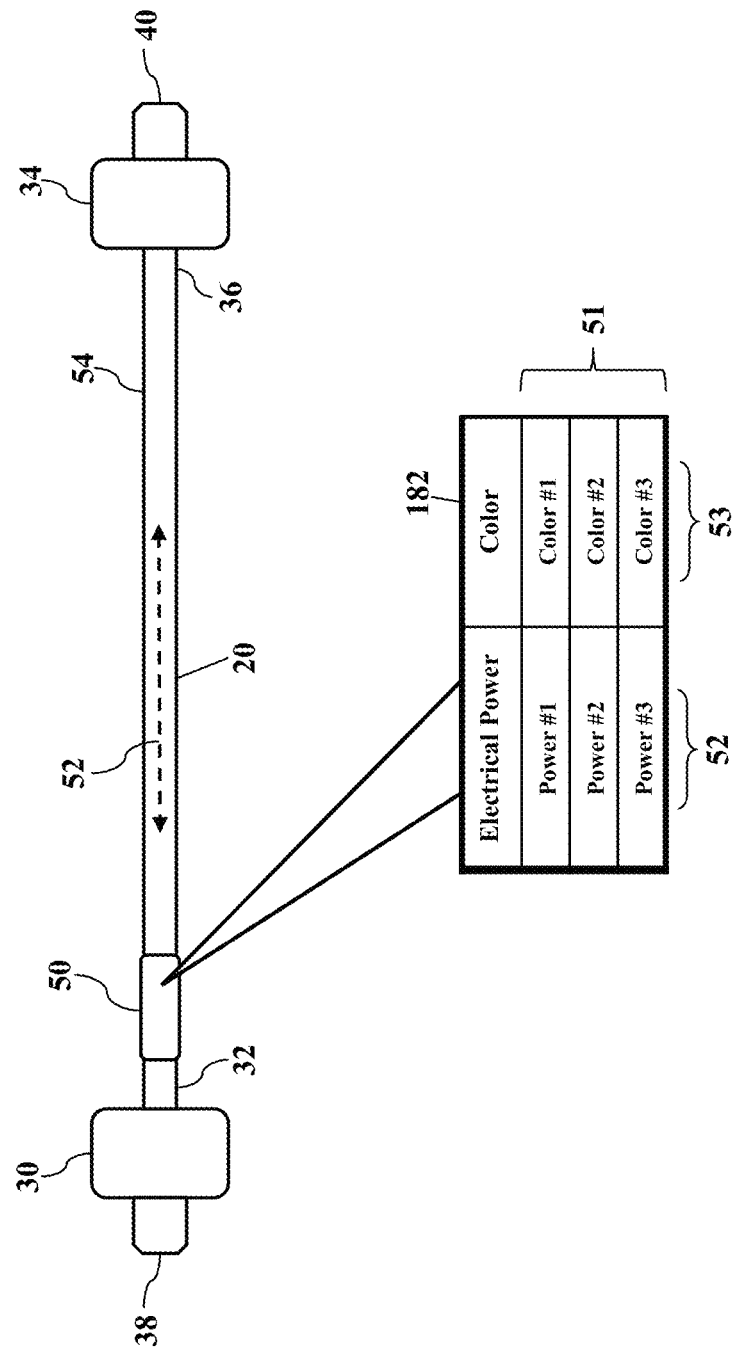
FIG. 3 is a schematic illustrating a range of colors of a visual indicator, according to exemplary embodiments.

FIG. 3 is a schematic illustrating a range 51 of colors of the visual indicator 50, according to exemplary embodiments. Here the visual indicator 50 may assume one of the colors 53 in the range 51 of colors in the presence of different heats or fields. That is, the visual indicator 50 may gradually or quickly change colors within a spectrum, in response to several different heat or field exposures. The range 51 of colors may be chemically formulated to coincide with the different heats or fields. Different values of the electrical power 52 may cause the visual indicator 50 to indicate a different one of the range 51 of colors. Should the electrical power 52 in the cable assembly 20 be less than 50% of its rated value, for example, perhaps the visual indicator 50 makes no change or assumes a color 53 in a lower spectrum. Yet, as the electrical power 52 approaches rated capacity, the visual indicator 50 may change to a different color 53 higher in the spectrum. The visual indicator 50 thus informs the user that the cable assembly 20 is approaching its rated capacity. The higher spectrum color 53 thus alerts the user to avoid inadvertent overload of the cable assembly 20. While FIG. 3 only illustrates a few different colors 53, in practice the visual indicator 50 may be chemically tuned for many different colors for many different electrical powers 52.

Figure 4:
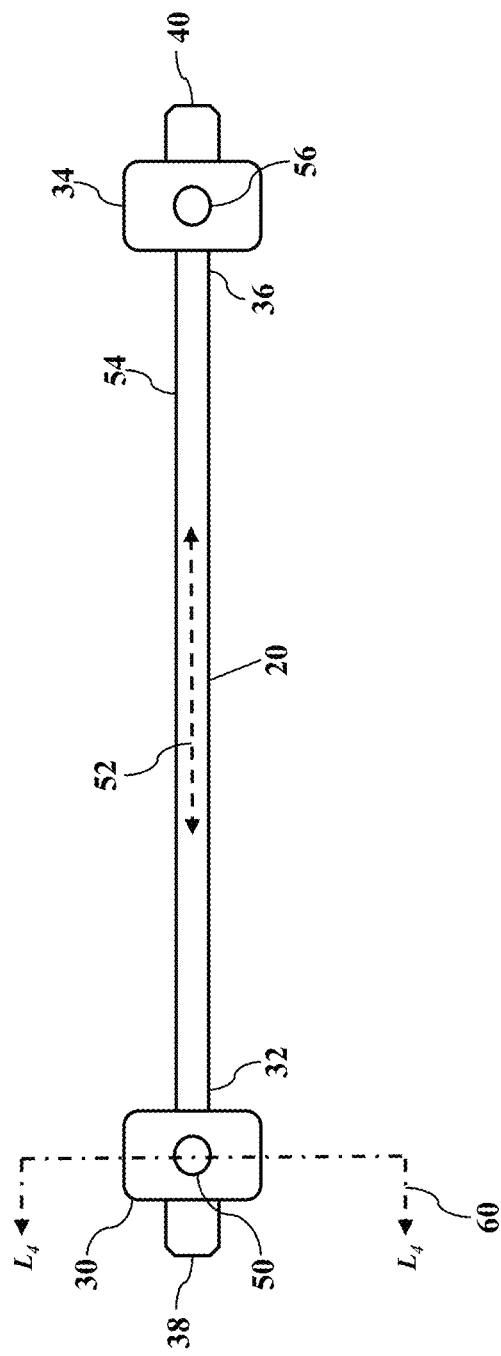
FIGS. 4-5 are schematics illustrating a visual indicator for a cable assembly, according to exemplary embodiments.
Figure 5:
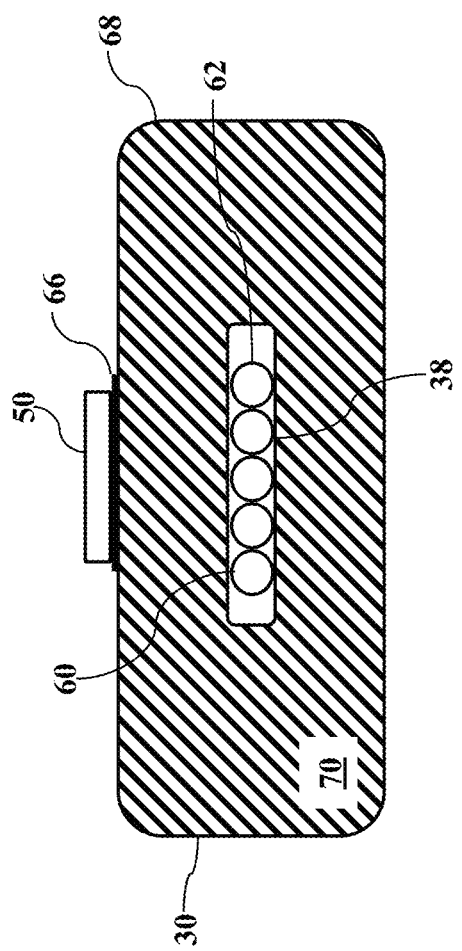

FIGS. 4-5 are schematics further illustrating the visual indicator 50, according to exemplary embodiments. Here the visual indicator 50 is incorporated into at least one of the heads 30 and 34 of the cable assembly 20. FIG. 4, for example, illustrates the first head 30 including the visual indicator 50, yet the second head 34 may additionally or alternatively include another visual indicator 56. Regardless, the visual indicator (50 and 56) indicates the corresponding head (30 and 34) has been exposed to the excessive electrical power 52 within the cable assembly 20.

FIG. 5 is a sectional view of the first head 30. The sectional view is taken along line $L_4$ (illustrated as reference numeral 60) of FIG. 4. The first head 30 is enlarged for clarity of features. The internal metallic conductors 62 and/or optical fibers 64 may originate, or terminate, at the corresponding connector 38. A portion of the internal metallic conductors 62 and/or optical fibers 64 may thus be inserted through the first head 30. Alternatively, the first head 30 may be over molded onto and around the internal metallic conductors 62 and/or optical fibers 64. Regardless, should the internal metallic conductors 62 and/or optical fibers 64 be subjected to the excessive electrical power (illustrated as reference numeral 52 in FIGS. 2-4), the corresponding heat and/or electromagnetic field may cause the visual indicator 50 to change its appearance. The visual indicator 50 may be adhesively adhered (using an adhesive 66) to an outer surface 68 of the first head 30, thus being visible from an inspection of the first head 30. For example, as the excessive electrical power 52 is applied, any heat may outwardly radiate or conduct from the conductor 62, through a material housing 70 of the first head 30, to the visual indicator 50. The excessive electrical power 52 thus increases the ambient temperature of the visual indicator 50. Similarly, an electrical/magnetic field propagates from the conductor 62 through the material housing 70 to the visual indicator 50. The heat and/or field thus causes the visual indicator 50 to change its visual appearance.

Figure 6:
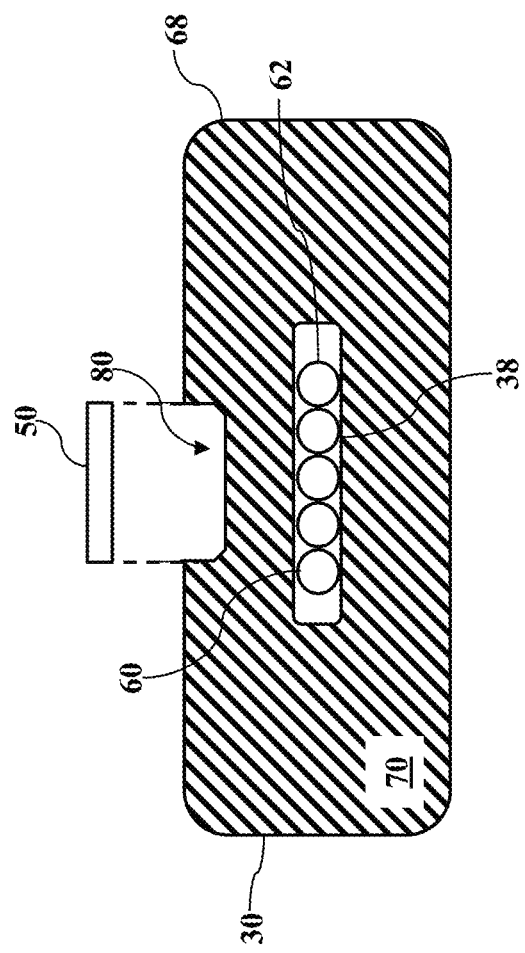
FIGS. 6-7 are sectional views of a cable head, according to exemplary embodiments.
Figure 7:
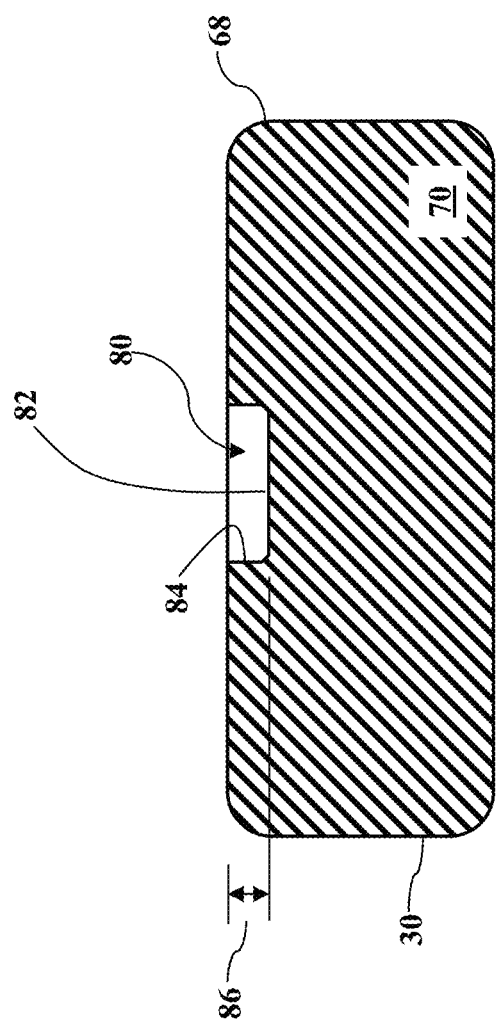

FIGS. 6-7 are more sectional views of the first head 30, according to exemplary embodiments. The sectional views are again taken along line $L_4$ (illustrated as reference numeral 60) of FIG. 4. Here, though, the visual indicator 50 may insert into the housing 70 of the first head 30. The housing 70 may have a recess 80 into which the visual indicator 50 inserts. The recess 80 has a floor 82 and a wall 84. The recess 80 may have any diameter and cross-sectional shape to suit the design of the visual indicator 50 and/or the first head 30. The wall 84 has a height that defines a depth 86 of the recess 80. The visual indicator 50 may be secured within the recess 80 (such as perhaps using the adhesive 66 illustrated in FIG. 5). However, any mechanical fastener, weld, or any other means for securing the visual indicator 50 secured within the recess 80 may be used.

Figure 8:
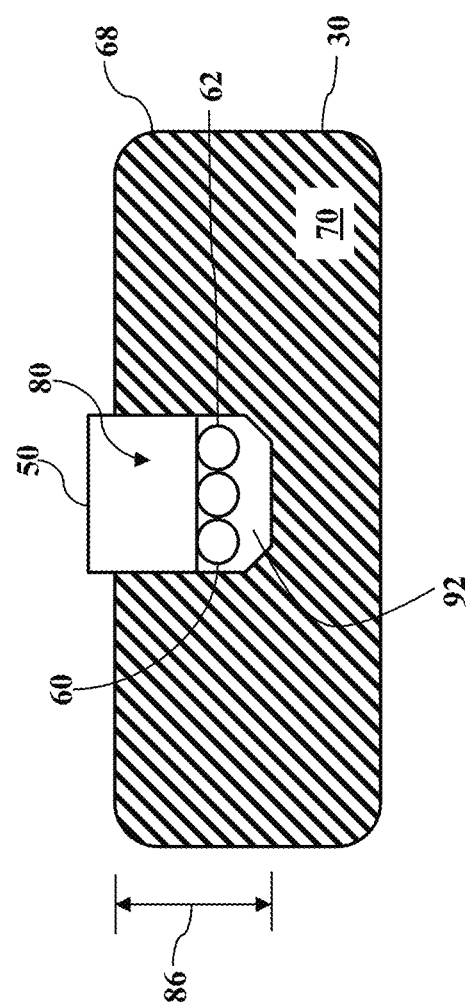
FIG. 8 is a schematic illustrating physical contact of the visual indicator, according to exemplary embodiments.

FIG. 8 is a schematic illustrating physical contact, according to exemplary embodiments. The sectional view is again taken along line $L_4$ (illustrated as reference numeral 60) of FIG. 4. Here the visual indicator 50 may physically contact one or more of the internal metallic conductors 60 and/or optical fibers 62 within the first head 30. That is, the recess 80 extends down into the housing 70 to a depth 90 of intersection. The recess 80 may thus be a well 92 that is molded, bored, or drilled into the first head 30. The visual indicator 50 may be inserted into, or pressed into, the well 92 and into physically contact with at least one of the internal metallic conductors 60 and/or optical fibers 62 within the first head 30. Any means for securing the visual indicator 50 within the well 92 may be used. Regardless, any heat and/or field thus causes the visual indicator 50 to change its visual appearance.

Figure 9:
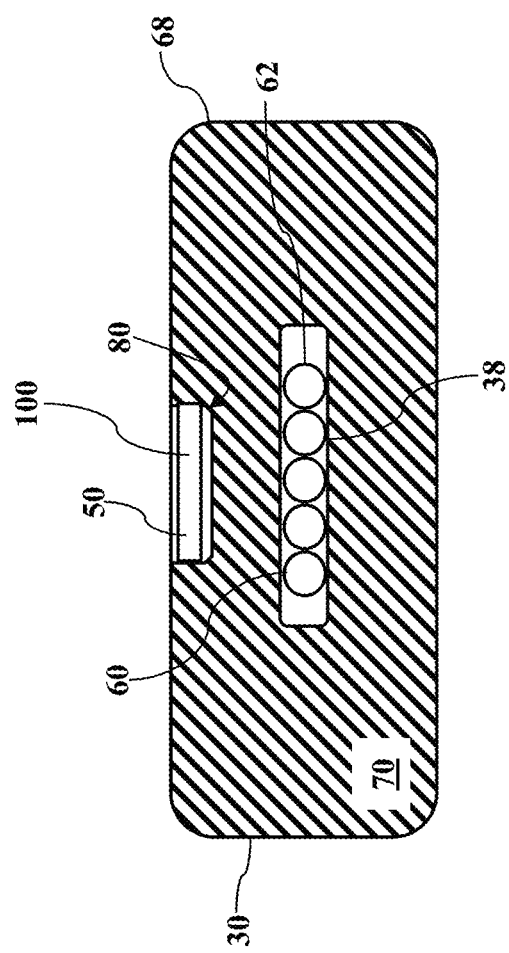
FIGS. 9-12 are sectional views illustrating a molten condition of the visual indicator, according to exemplary embodiments.
Figure 10:
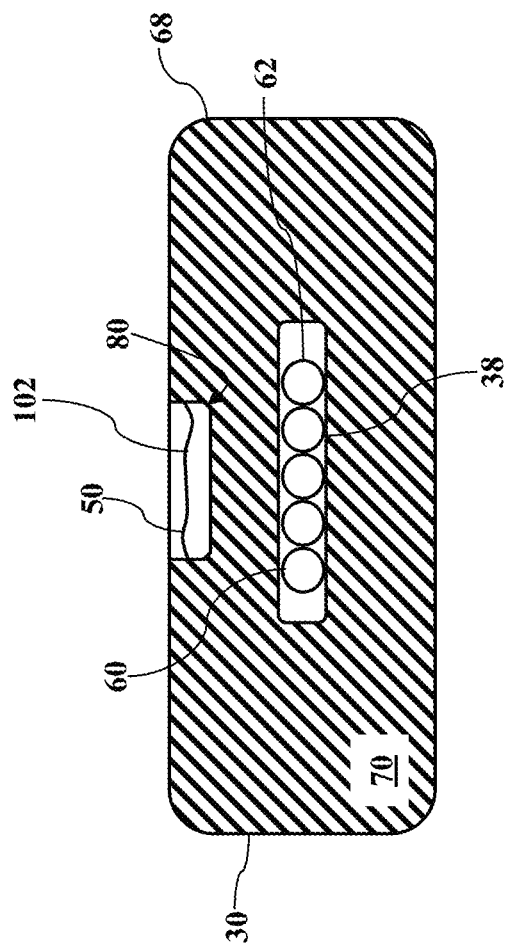

FIGS. 9-12 are sectional views illustrating a molten condition, according to exemplary embodiments. The sectional views are again taken along line $L_4$ (illustrated as reference numeral 60) of FIG. 4. Here the visual indicator 50 lies within the recess 80 and melts in response to the excessive electrical power (illustrated as reference numeral 52 in FIGS. 2-4). As FIG. 9 illustrates, the visual indicator 50 normally has a solid state 100. That is, the visual indicator 50 has a chemical composition that is a solid at temperatures in the normal operating range of voltage or current in the internal metallic conductors 60 and/or optical fibers 62 within the first head 30. As FIG. 10 illustrates, though, the visual indicator 50 may change to a molten state 102 when the excessive electrical power is experienced. The excessive electrical power in the internal metallic conductors 60 generates heat that conducts to the visual indicator 50. The heat alters the visual indicator 50 from its solid state 100 to its molten state 102. The visual indicator 50 may thus transform to a gel or even to a liquid form to indicate the excessive electrical power 52.

Figure 11:
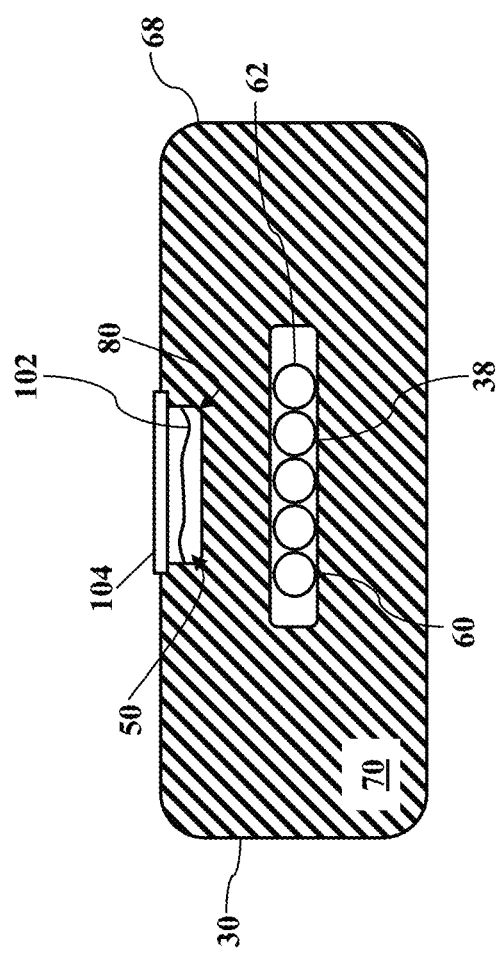

FIG. 11 illustrates containment of the molten state 102. As the reader may predict, the molten state 102 may itself cause problems, with a gel or liquid possibly contaminating nearby equipment and creating an electrical hazard if electrically conductive. The recess 80, then, may have a cover 104 to contain the molten state 102 of the visual indicator 50. The cover 104 may be sized to an outer circumference or perimeter of the recess 80. The molten state 102 of the visual indicator 50 may thus be sealed within an inner volume (perhaps as defined by the wall 84 and floor 82, as illustrated in FIG. 7) of the recess 80. The cover 104 is preferably transparent, even colorless or clear, to ensure the molten state 102 of the visual indicator 50 is observable.

Figure 12:
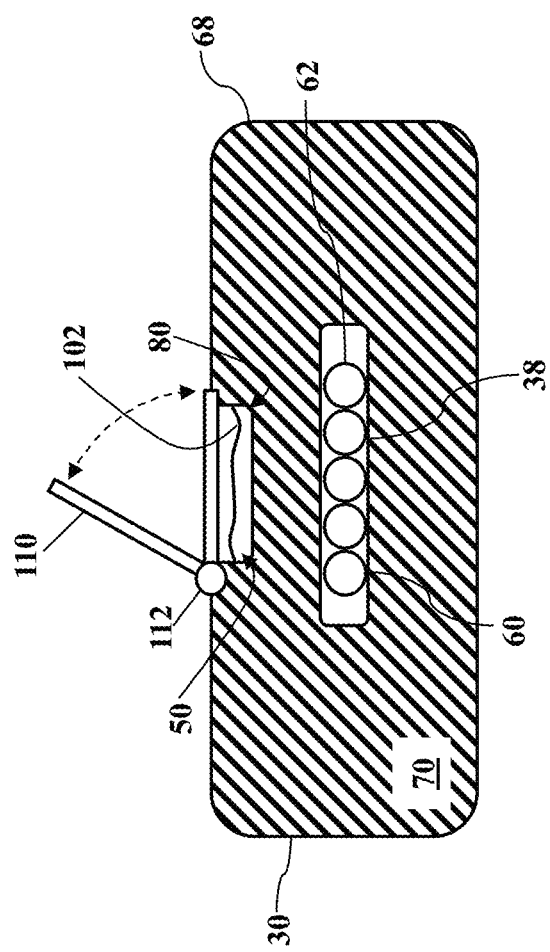

FIG. 12 illustrates a moveable lid 110 that contains the molten state 102. Here the visual indicator 50 may be replaced within the recess 80. That is, the lid 110 may slide, rotate, or remove to permit access to an interior compartment defined by the recess 80. A hinge 112, for example, would permit opening the recess 80 to replace an old, expired, or defective visual indicator 50. The visual indicator 50 may thus be removed and replaced with a new version. As another example, when heat from the excessive electrical power 52 alters the visual indicator 50 to its molten state 102, the cable assembly 20 may be removed and repaired. The moveable lid 110 would thus allow a new visual indicator 50 to be installed within the recess 80, thus renewing the cable assembly 20 for subsequent use.

Figure 13:
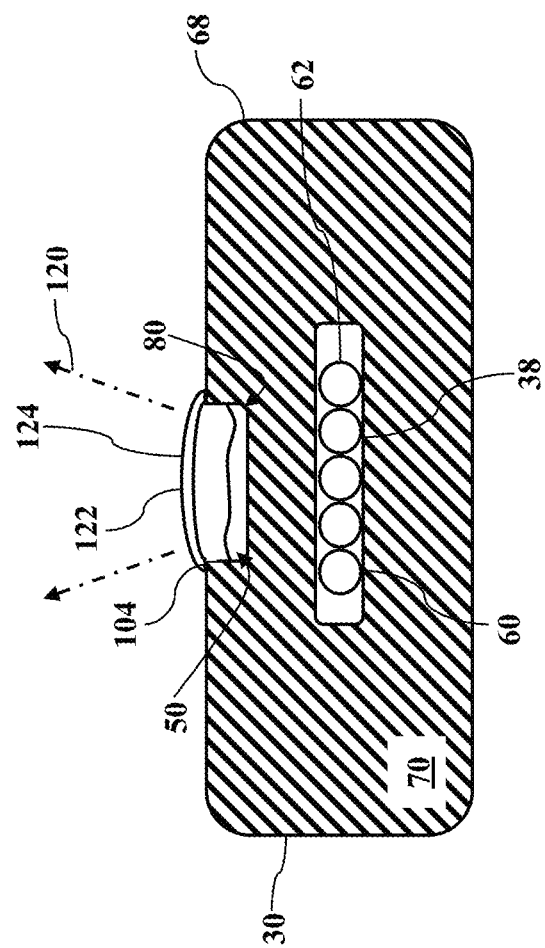
FIG. 13 is a schematic illustrating magnification of the visual indicator, according to exemplary embodiments.

FIG. 13 is a schematic illustrating magnification, according to exemplary embodiments. Here the first head 30 may optically diffuse the visual indicator 50, thus creating a magnification of the visual indicator 50. As the first head 30 of the cable assembly 20 may only be finger sized, the visual indicator 50 may be too small for reliable observance. The first head 30, then, may have optically diffusive qualities that magnify the visual indicator 50 for enhanced perception. As FIG. 13 illustrates, the cover 104 to the recess 80 may spread out an image of the visual indicator 50 to optically produce a magnified image 120. An outer surface 122 of the cover 104, for example, may have a convex cross-sectional contour 124, thus acting as a magnifying lens to enlarge an appearance of the visual indicator 50. Magnification may also be applied to the moveable lid 110.

Figure 14:
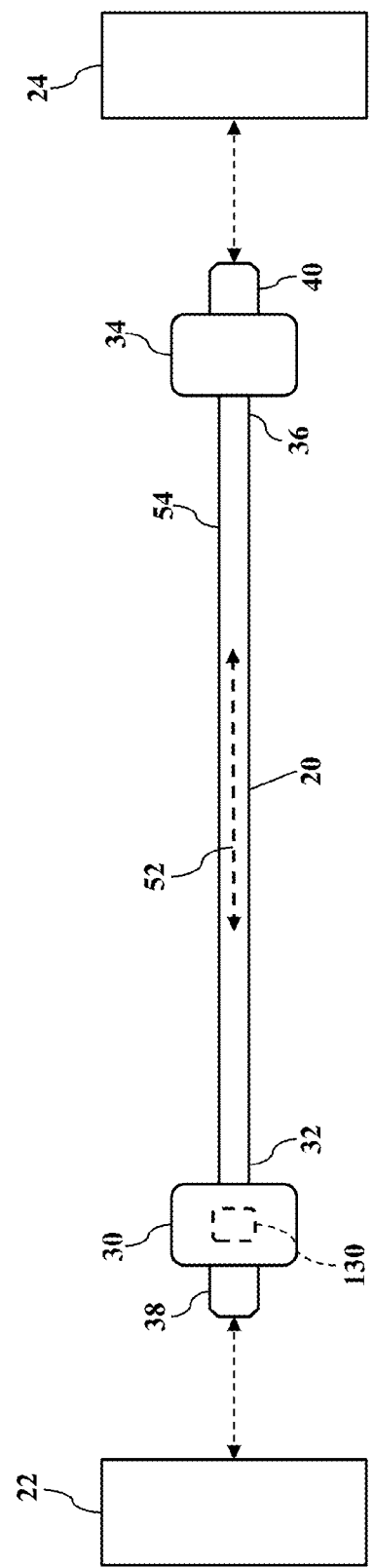
FIGS. 14-17 are block diagrams illustrating processor-controlled activation of the visual indicator, according to exemplary embodiments.
Figure 15:
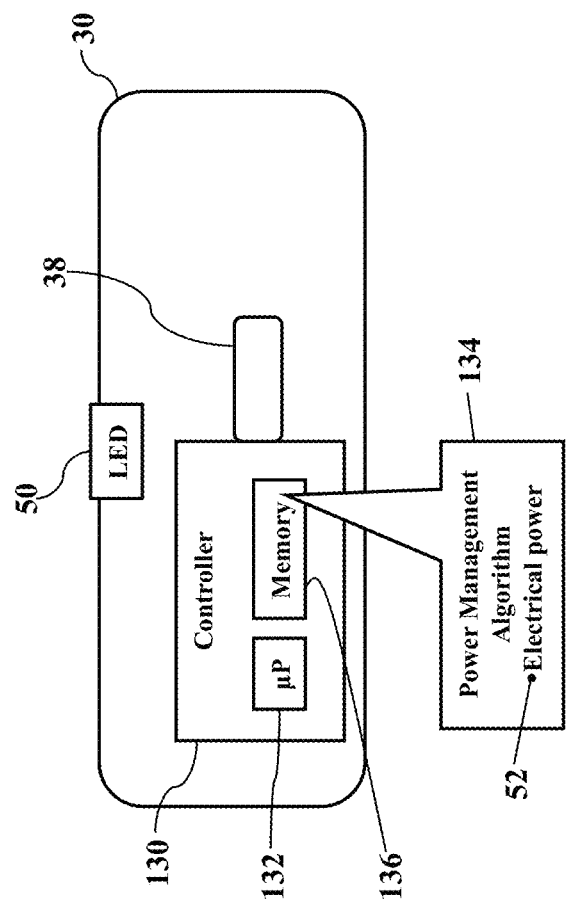

FIGS. 14-17 are block diagrams illustrating processor-controlled activation, according to exemplary embodiments. As FIG. 14 illustrates, the cable assembly 20 may have a controller 130 that manages communication between the devices 22 and 24. The first head 30, for example, may include the controller 130 for managing serial or parallel communication between the devices 22 and 24. Even the second head 34 may have its own controller, as later paragraphs will explain. For now, though, FIG. 15 illustrates the controller 130 operating within the first head 30. The controller 130 may have a processor 132 (e.g., "µP"), application specific integrated circuit (ASIC), or other component that executes a power management algorithm 134 stored in a memory 136. The controller 130 detects the presence of one or both of the devices 22 and 24 (illustrated in FIG. 14) detachably connected to the cable assembly 20. While the controller 130 manages communications with the devices 22 and 24, the controller 130 also manages the electrical power 52 propagating along the cable assembly 20. That is, the power management algorithm 134 is a set of programming, code, or instructions that cause the processor 54 to perform operations of monitoring the current, voltage, and/or the electrical power 52 applied to, or received by, the connector 38. Should the processor 132 determine that the electrical power 52 exceeds a rating of the cable assembly 20, the processor 132 may take actions to protect the cable assembly 20.

The processor 132 may activate the visual indicator 50. Here the visual indicator 50 (such as a light emitting diode or "LED") illuminates to visually warn of the excessive electrical power 52. The light emitting diode, for example, may insert into, or be observable from, the recess 80 in the housing 70 (as FIG. 6 illustrated). The transparent cover 104 may protect the light emitting diode installed within, or protruding from, the recess 80 (as FIGS. 11-13 illustrate). The transparent cover 104 may further magnify an output of the light emitting diode, as earlier explained. Furthermore, the power management algorithm 134 may cause the processor 54 to illuminate the light emitting diode using a red output to indicate the excessive electrical power 52. The light emitting diode may have a green output under normal operating conditions.

Figure 16:
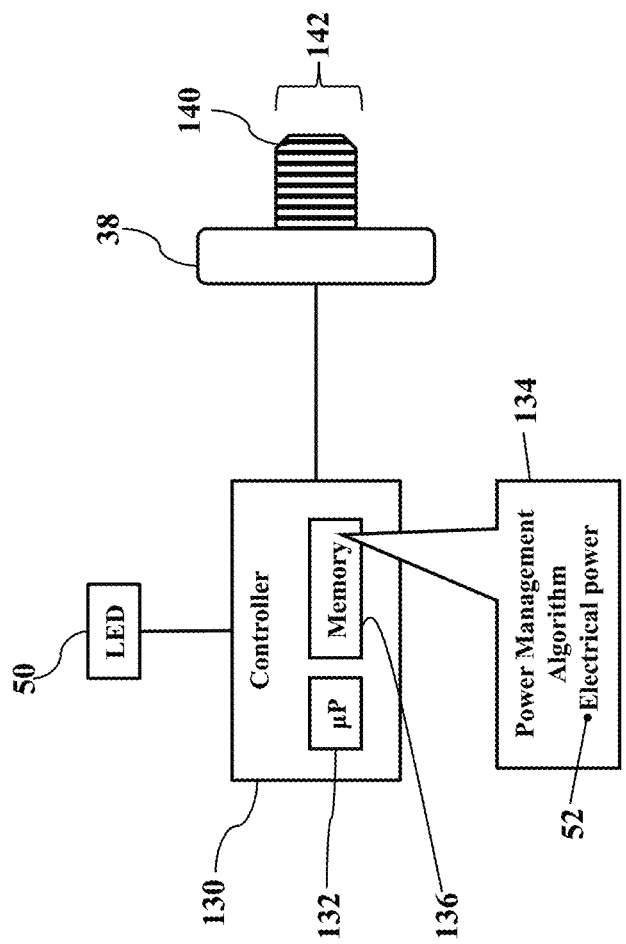

FIG. 16 further illustrates power management. Here the processor 132 may monitor the current, voltage, and/or electrical power 52 applied to, or received by, any pin 140 in the connector 38. The connector 38, for example, may have several connection pins 142, such has those found in conventional connectors. The processor 132 may monitor the electrical power 52 at any individual pin 140 in the connector 38. Should the pin 140 experience the excessive electrical power 52, the processor 132 may activate or change the visual indicator 50 to indicate a fault.

Figure 17:
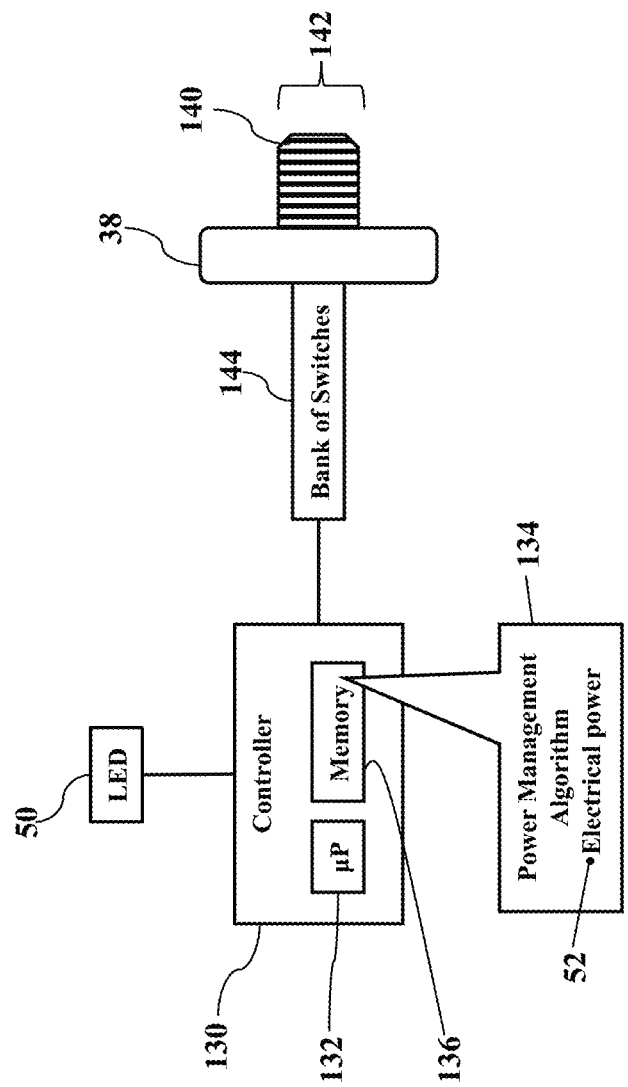

FIG. 17 illustrates pin-by-pin power management. Should any individual pin 140 experience the excessive electrical power 52, the processor 132 may isolate the pin 140. That is, the processor 132 may open or disconnect a connection to the pin 140, thus severing electrical connection and/or communication from the pin 140. A bank 144 of switches, for example, may be micro- or nano-sized to electrically isolate any one of the pins 142. Each individual switch in the bank 144 of switches may be individually activated and/or addressed by the processor 132 to selectively open or close a corresponding electrical connection with the pin 140. Should the individual pin 140 experience the excessive electrical power 52, the processor 132 may physically and/or logically open the corresponding switch to protect the cable assembly 20. The processor 132 may also activate or change the visual indicator 50 to indicate a fault.

Figure 18:
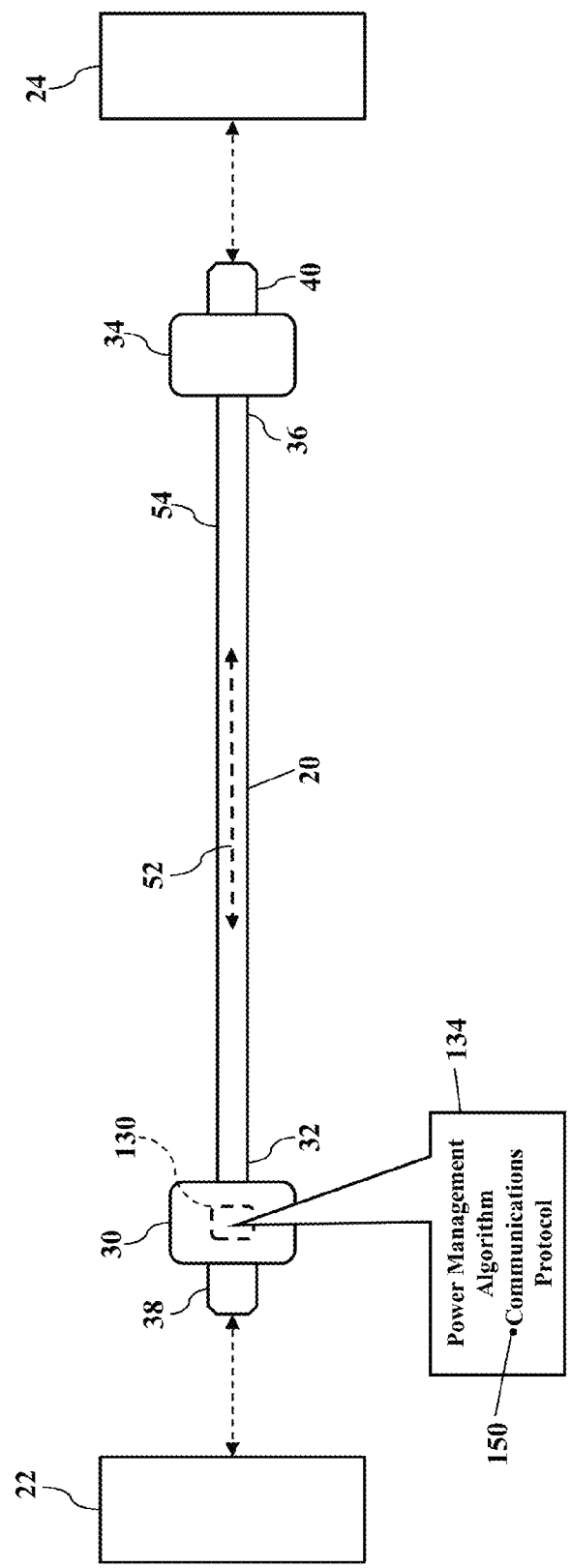
FIGS. 18-20 are schematics illustrating interface capabilities of the cable assembly, according to exemplary embodiments.
Figure 19:
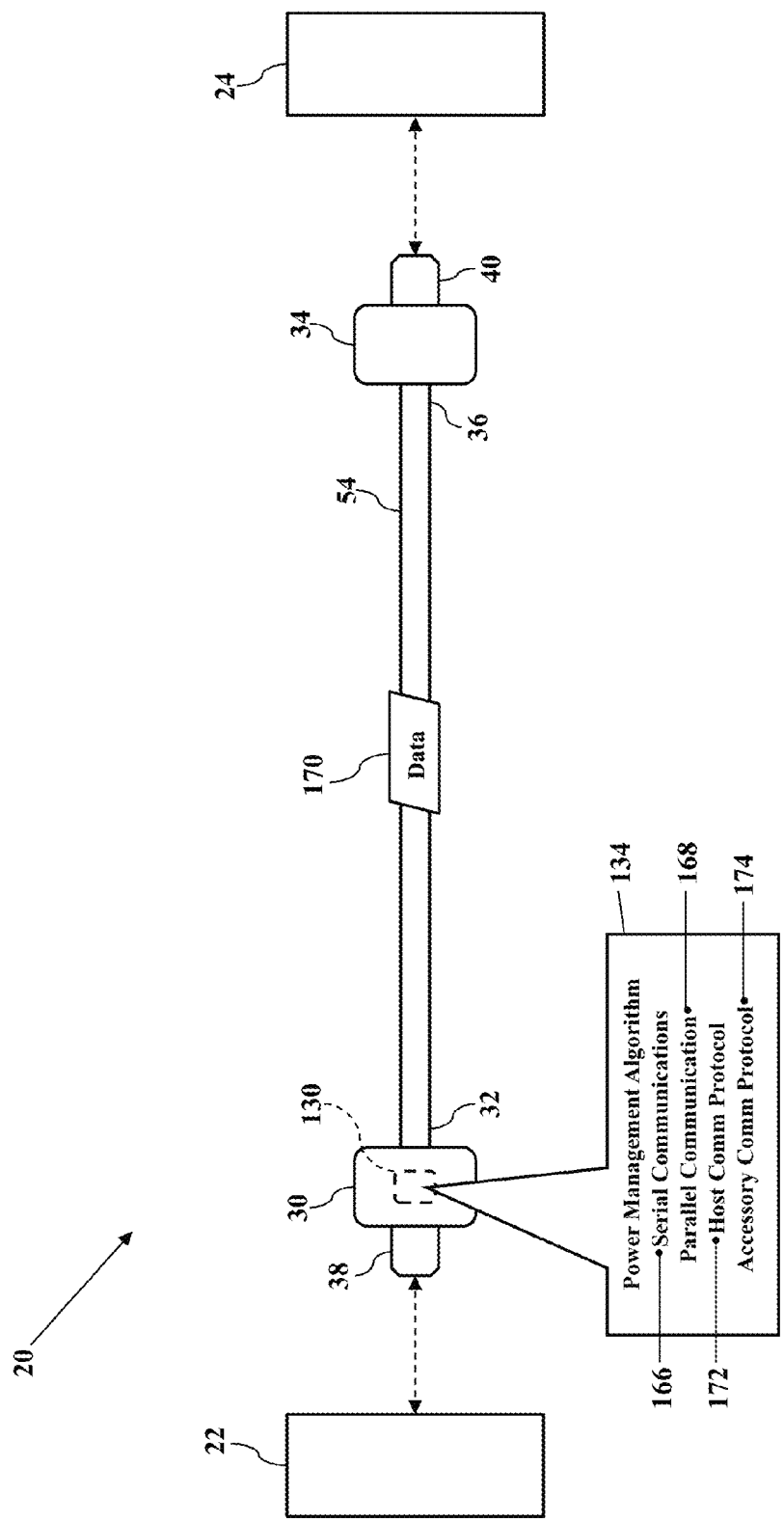
Figure 20:
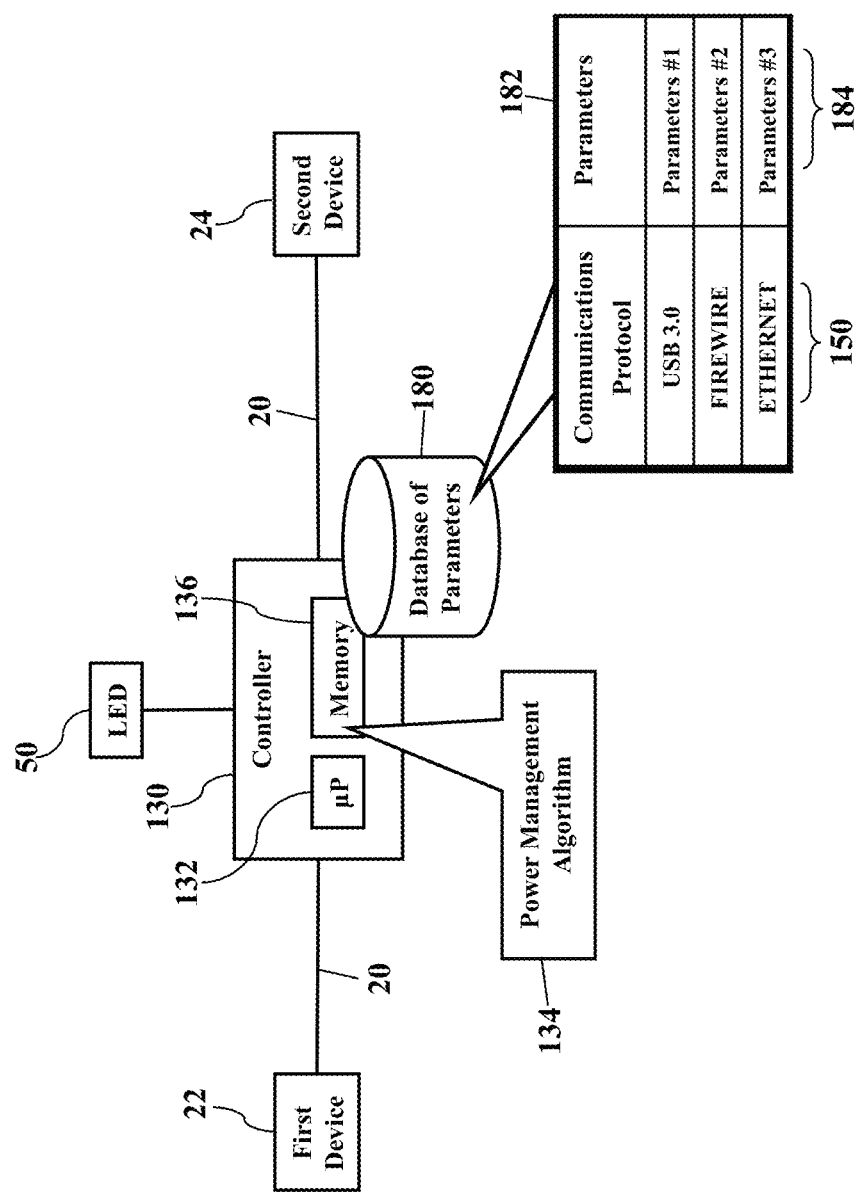
Figure 21:
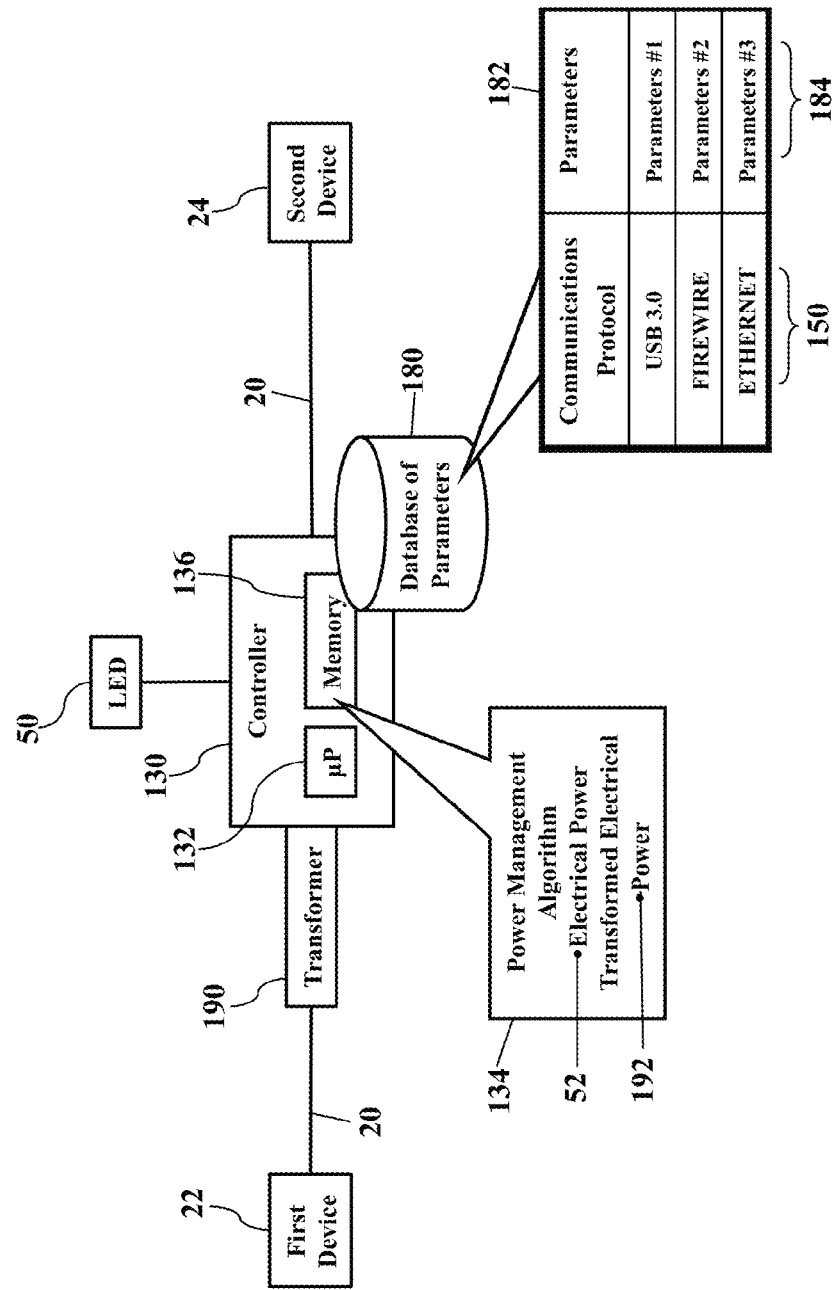
FIGS. 21-26 are block diagrams illustrating power transformation by the cable assembly, according to exemplary embodiments.

FIGS. 18-20 are schematics illustrating interface capabilities of the cable assembly 20, according to exemplary embodiments. Because the cable assembly 20 may manage or provide communications between the two devices 22 and 24, the controller 130 may perform interface operations. That is, when the cable assembly 20 interconnects the two devices 22 and 24, the power management algorithm 134 may cause the controller 130 to detect and identify the two devices 22 and 24. The controller 130 may then retrieve and execute a communications protocol 150 required by either device 22 or 24. The controller 130 may thus translate any data communicating along the cable assembly into different formats.

FIG. 19 is a more detailed illustration. The cable assembly 20 may manage serial communication 166, and/or parallel communication 168, between the first device 22 and the second device 24. The serial communication 166 sends data 170 one bit at a time, sequentially, over one or more of the internal metallic conductors and/or optical fibers (not shown for simplicity). However, the cable assembly 20 may utilize the parallel communication 168 in which the data 170 is sent in several bits at a time, perhaps using parallel channels, over the internal metallic conductors and/or optical fibers.

Protocols are executed. The first device 22 may require a host communications (or "Comm") protocol 172, while the second device 24 may require an accessory communications protocol 174. As the reader may realize, the cable assembly 20 may interconnect a wide variety of devices from different manufacturers, each perhaps requiring a different input/output formatting. So, when the second device 24 sends the data 170 to the first device 22, the data 170 may need to be formatted to the input/output format required by the first device 22. The controller 130 in the first head 30 may thus convert the data 170 into the host communications protocol 172 required by the first device 22. The power management algorithm 134 instructs the controller 130 to translate the data 170 into reformatted data using the host communications protocol 172. Similarly, when the first device 22 sends the data 170 to the second device 24, the data 170 may need to be formatted according to the input/output format required by the second device 24. The power management algorithm 134 may thus instruct the controller 130 to translate the data 170 into reformatted data using the accessory communications protocol 174. The serial and/or parallel data 170 is thus converted to the appropriate input/output format desired by a receiving device. The cable assembly 20 thus provides a communications interface between the second device 24 and the first device 22.

FIG. 20 illustrates a database 180 of parameters. Because the cable assembly 20 may interconnect a wide variety of devices from different manufacturers, the devices 20 and 24 may self-identify themselves. That is, when the cable assembly 20 is physically connected to any device 20 or 24, the device 20 or 24 self-identifies itself to the controller 130. The controller 130 then queries the database 180 of parameters for the corresponding formatting. FIG. 20, for example, illustrates the database 180 of parameters as a table 182 that maps, associates, or relates the different communications protocols 150 to different formatting parameters 184. While FIG. 19 only illustrates a few of the many different communications protocols 150, in practice the database 180 of parameters may have many entries for most or all communications protocols 150. Regardless, the controller 130 receives the communications protocol 150 and queries the database 180 of parameters for the corresponding formatting parameters 184. FIG. 20 illustrates the database 180 of parameters as being locally stored in the memory 136 of the cable assembly 20, but the database 180 of parameters may be remotely accessed at any network location from any communications network. Regardless, the controller 130 retrieves the formatting parameters 184 that correspond to the required communications protocol 150. If the controller 130 is unable to retrieve the desired communications protocol 150, or unable to perform a translation, the power management algorithm 134 may cause the controller 130 to activate or change the visual indicator 50 to indicate a fault.

Figure 22:
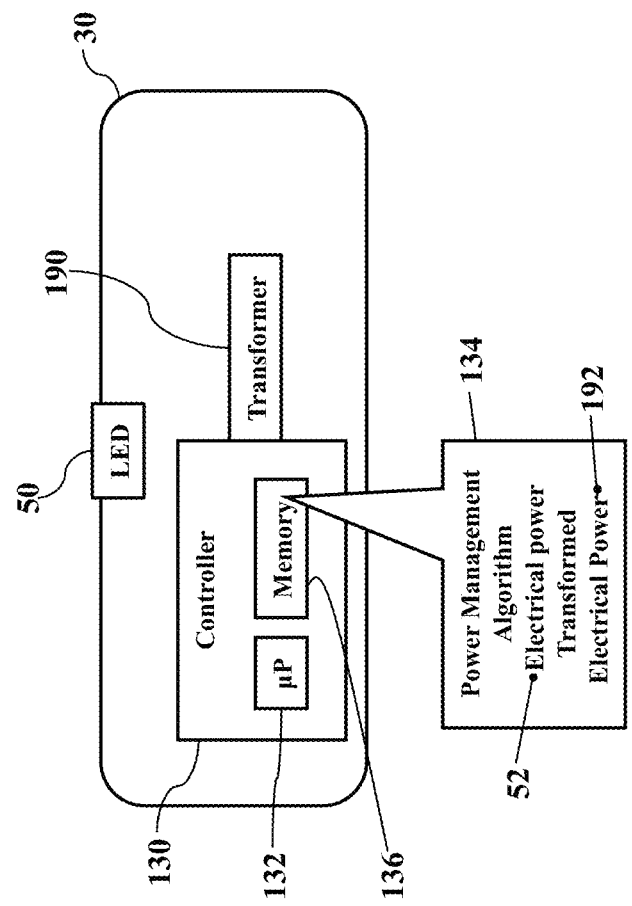
Figure 23:
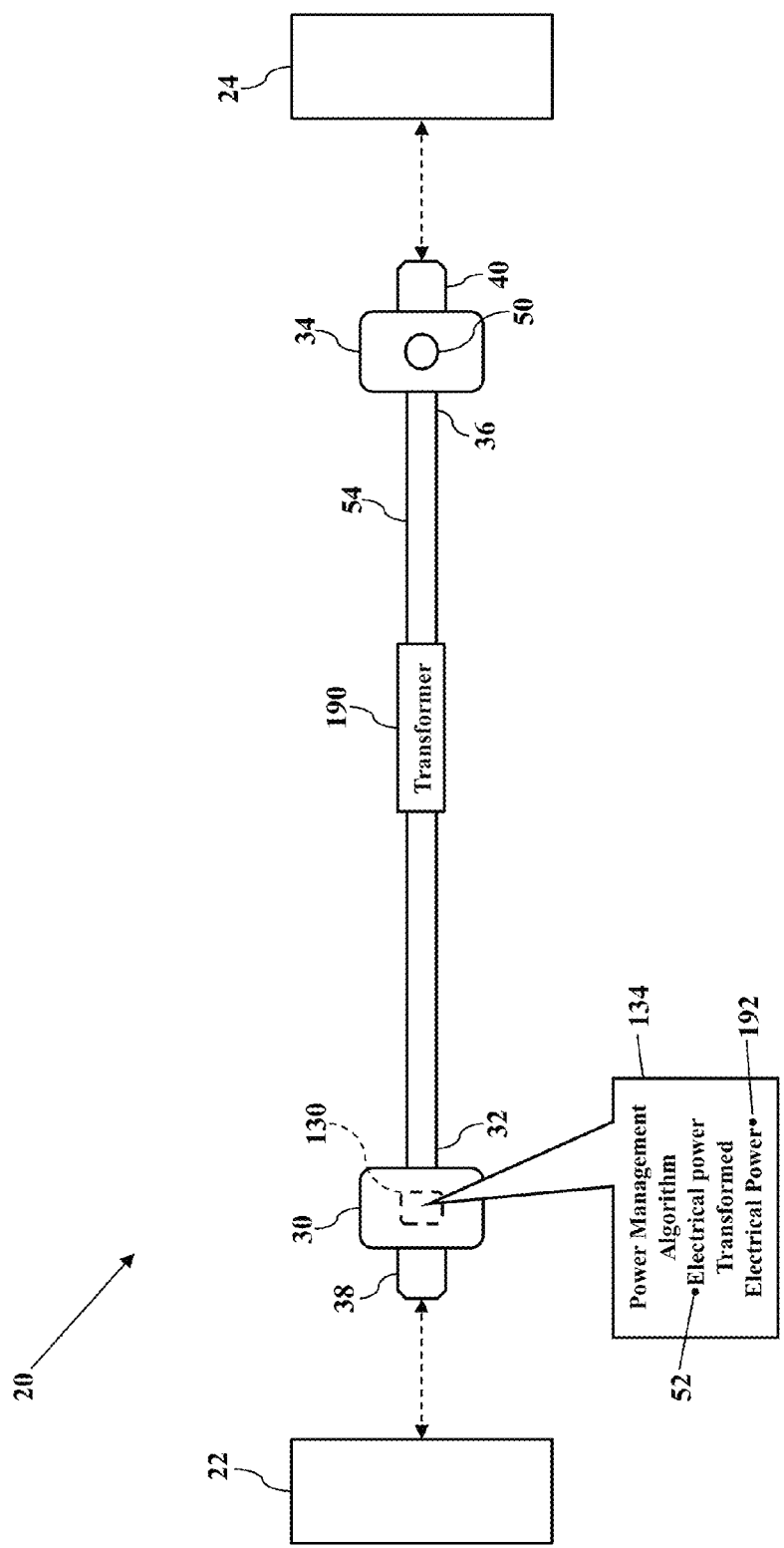

FIGS. 21-26 are block diagrams illustrating power transformation by the cable assembly 20, according to exemplary embodiments. Here the cable assembly 20 may transform electrical power into a different voltage, current, and/or frequency. When the cable assembly 20 is physically connected between the devices 20 and 24, the cable assembly 20 may transfer the electrical power 52 along its internal conductors (not shown for simplicity). The first device 22, for example, may pass or deliver the electrical power 52 via the cable assembly 20 to the second device 24. The electrical power 52, however, may need to be transformed to suit the requirements of the second device 24. The power management algorithm 134 may thus cause the controller 130 to instruct a transformer 190 to output a transformed electrical power 192. FIG. 22 illustrates the transformer 190 integrated into and operating within the first head 30, while FIG. 23 illustrates the transformer 190 interconnected in-line between the first head 30 and the second head 34. Regardless, when the electrical power 52 is sent along the cable assembly 20, the controller 130 instructs the transformer 190 to output the transformed electrical power 192 at the voltage, current, and/or frequency desired by the second device 24. If the controller 130 determines that the transformer 190 is unable to output the transformed electrical power 192, the power management algorithm 134 may cause the controller 130 to activate or change the visual indicator 50 to indicate a fault.

Figure 24:
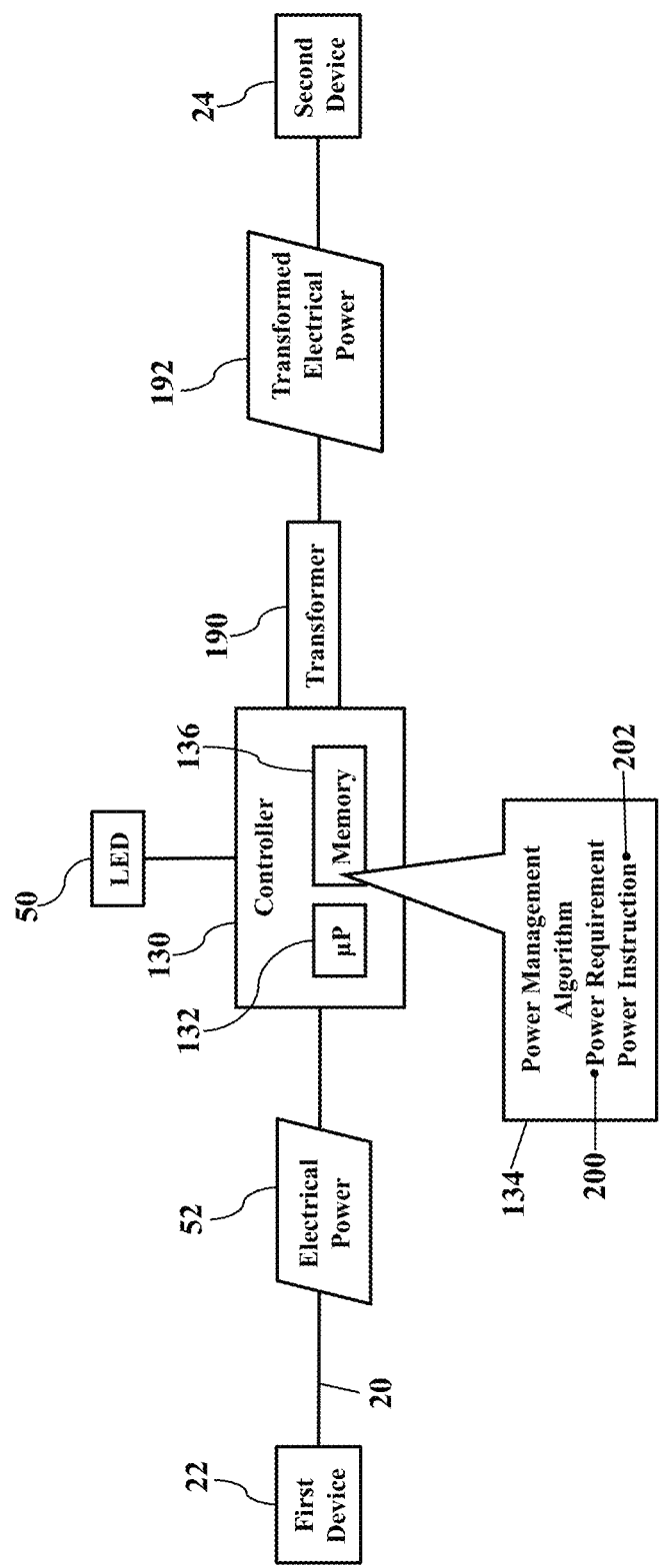

FIG. 24 illustrates a power requirement 200. Again, because the cable assembly 20 may interface with a wide variety of devices from different manufacturers, the cable assembly 20 may need the power requirement 200 of many different manufacturers' devices. Here, then, the cable assembly 20 may receive the power requirement 200 for a connected device. As FIG. 24 illustrates, the second device 22 may send its voltage, current, frequency, or other power requirement 200 to the controller 130. The controller 130 receives the power requirement 200 and generates a power instruction 202 for the transformer 190. The transformer 190 may thus be instructed to receive the electrical power 52 from the first device 22 and to output the transformed electrical power 192, according to the corresponding power requirement 200 of the second device 24. If the power transformation fails, the power management algorithm 134 may cause the controller 130 to activate or change the visual indicator 50 to indicate a fault.

Figure 25:
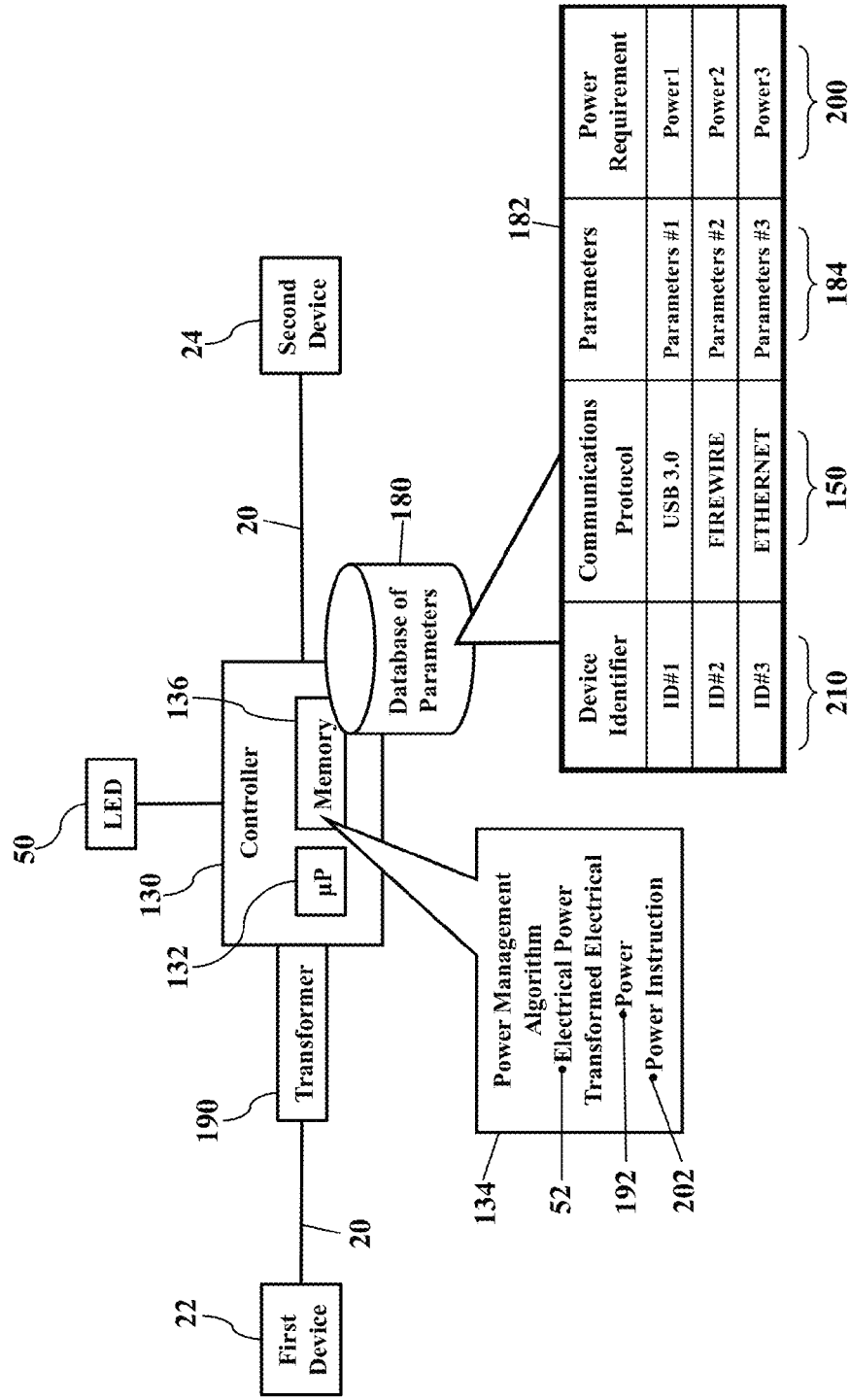

FIG. 25 further illustrates the database 180 of parameters. Here the database 180 of parameters may include entries for different power requirements 200 of different devices. Again, because the cable assembly 20 may interface with a wide variety of devices from different manufacturers, the cable assembly 20 may need the power requirements 200 of many different manufacturers' devices. Here, then, the database 180 of parameters may also include entries for the different power requirements 200 for different device identifiers 210. That is, when any device (such as 22 or 24) self-identifies itself to the controller 130 in the cable assembly 20, the device 22 or 24 may send its corresponding device identifier 210 (such as a model number, manufacturer, or other unique identifier). The controller 130 queries the database 180 of parameters for the corresponding power requirements 200. The controller 130 retrieves the power requirements 200 that are associated with the device identifier 210. The controller 130 generates and sends the power instruction 202 to the transformer 190 to output the corresponding power requirements 200. If the power transformation fails, the power management algorithm 134 may cause the controller 130 to activate or change the visual indicator 50 to indicate a fault.

Figure 26:
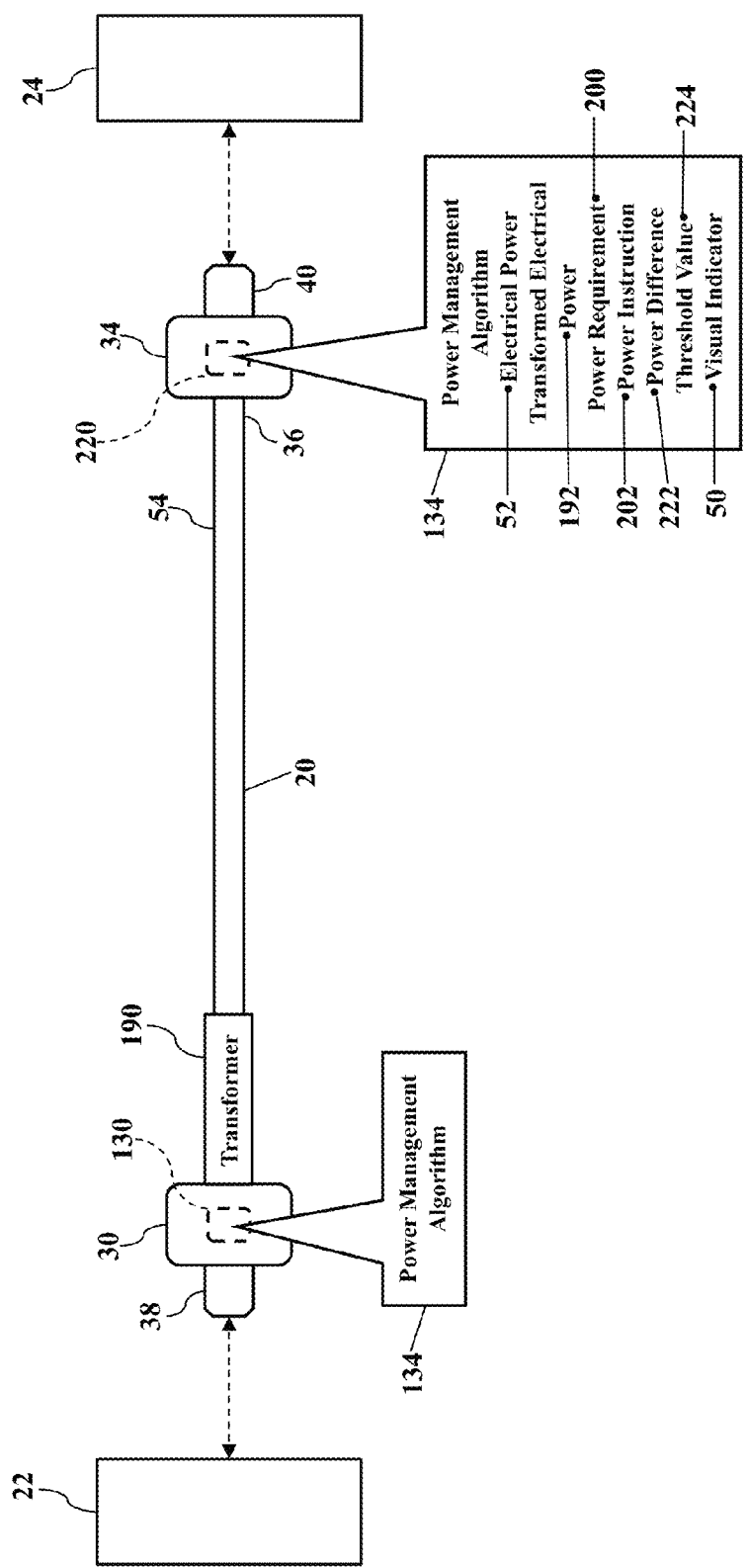

FIG. 26 illustrates self-diagnosis of the power transformation. Here the first head 30 connects to the first device 22 and has its own controller 130. The second head 34 connects to the second device 24 and has its own corresponding second controller 220. Once the power requirements 200 of the second device 24 are known (as explained above), the transformer 190 is instructed to output the power requirements 200 of the second device 24. The second controller 220 in the second head 34, for example, sends the power instruction 202 to the transformer 190. The transformer 190 is thus instructed to output the corresponding power requirement 200 of the second device 24. The second controller 220 in the second head 34 may then compare the transformed electrical power 192, output by the transformer 190, to the power requirements 200 of the second device 24. Any power difference 222 is compared to a threshold value 224. If the power difference 222 exceeds the threshold value 224, then the second controller 220 in the second head 34 may determine that the power transformation has erred. That is, a problem may exist in the transformer 190 and/or in some other component of the cable assembly 20. Regardless, the power management algorithm 134 may thus cause the second controller 220 to activate the visual indicator 50 to visually alert of the problem.

Figure 27:
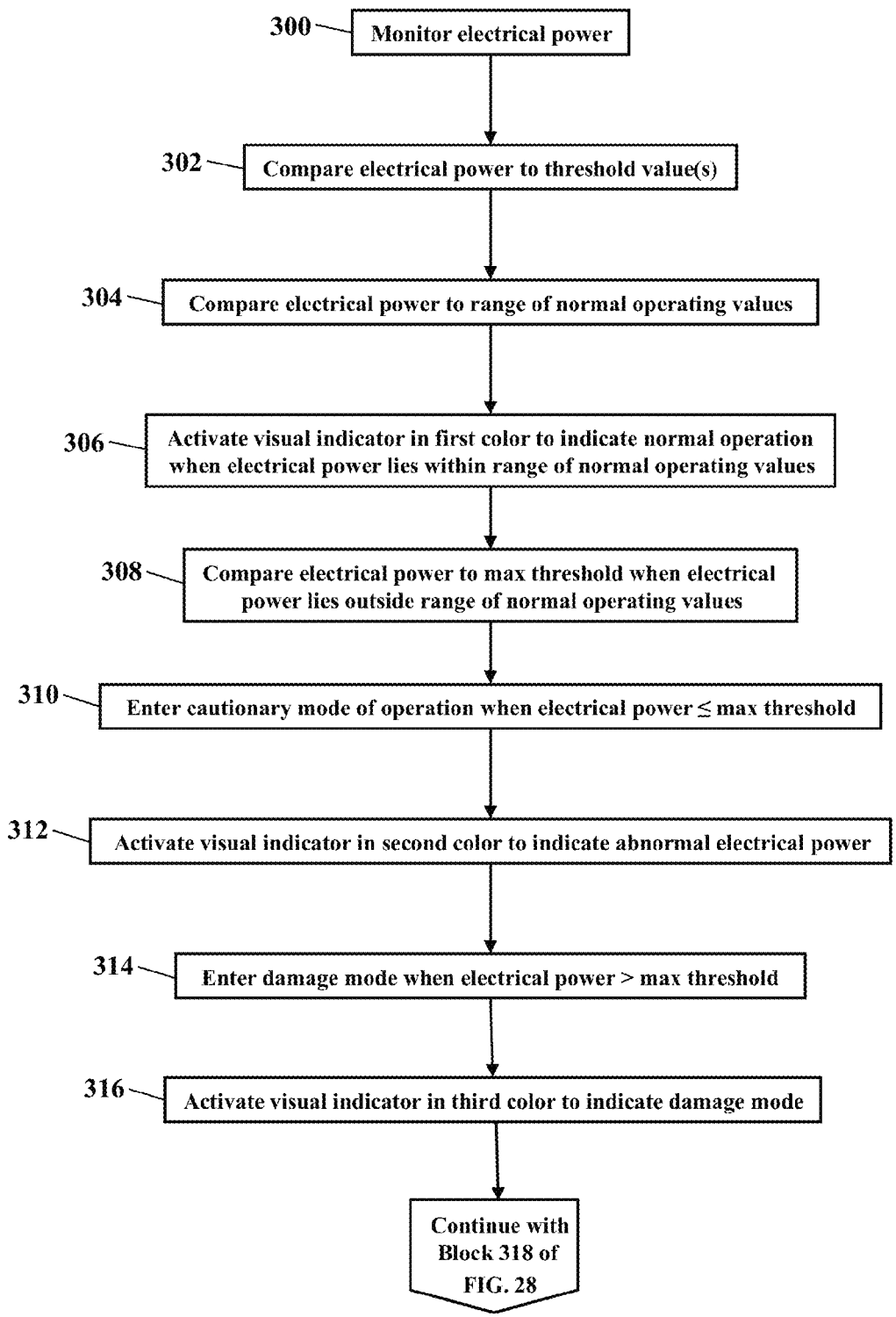
FIGS. 27-28 are flowcharts illustrating an algorithm for monitoring electrical power in the cable assembly, according to exemplary embodiments.
Figure 28:
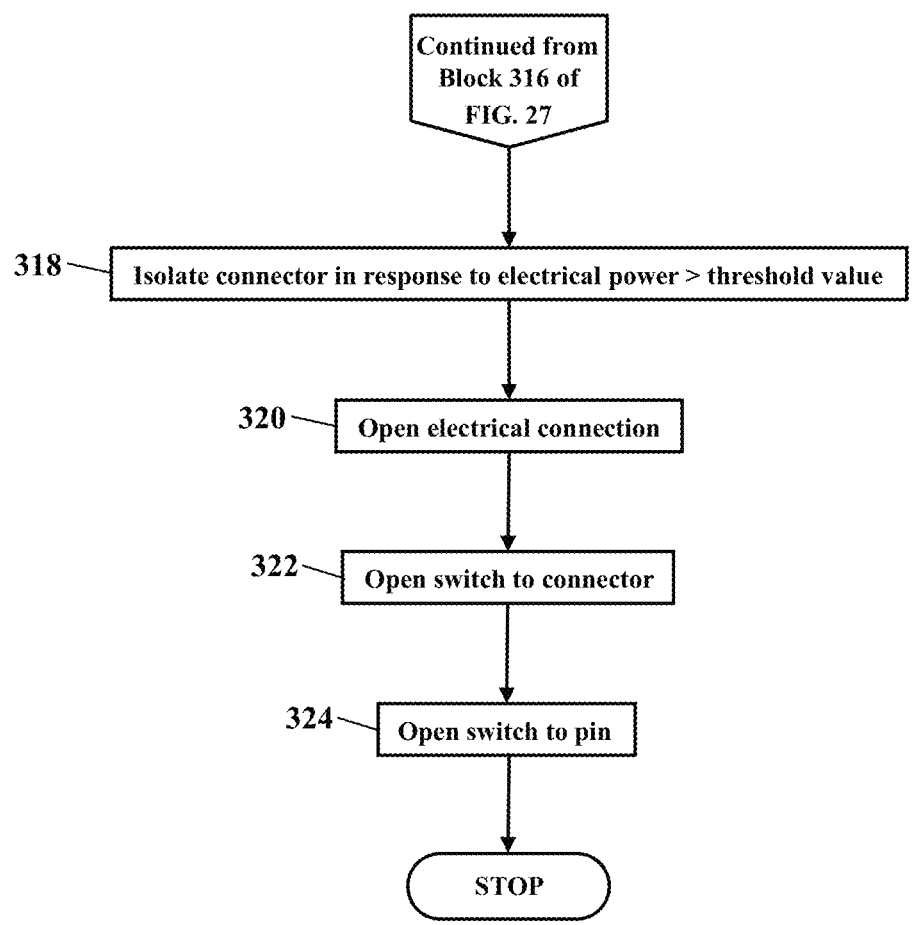

FIGS. 27-28 are flowcharts illustrating an algorithm for monitoring electrical power, according to exemplary embodiments. Electrical power 52 applied to a connector is monitored (Block 300). The electrical power 52 is compared to one or more threshold values 224 (Block 302). The electrical power 52, for example, may be compared to a range of normal operating values (Block 304). If the electrical power 52 lies within the range of normal operating values, the visual indicator 50 is activated to illuminate a first color (perhaps "green") indicating normal operation (Block 306). If the electrical power 52 lies outside the range of normal operating values, the electrical power is compared to a maximum threshold value (Block 308). The maximum threshold value may be an upper limit of the electrical power 52 at which damage may occur to the cable assembly 20. If the electrical power 52 is less than the maximum threshold value, a cautionary mode of operation is entered (Block 310). The visual indicator 50 is activated to illuminate a second color (perhaps "yellow") to indicate an abnormal current or voltage has been detected (Block 312). If the electrical power 52 exceeds the maximum threshold value, a damage mode of operation is entered (Block 314). The visual indicator 50 is activated to illuminate a third color (perhaps "red") indicating damage may have occurred (Block 316).

The algorithm continues with FIG. 28. The connector 38 or 40 may be isolated in response to the electrical power 52 exceeding the threshold value (Block 318). An electrical connection to the connector 38 or 40 may be opened in response to the electrical power 52 exceeding the threshold value (Block 320). A switch to the connector 38 or 40 (in the bank 144 of switches) may open in response to the electrical power 52 exceeding the threshold value (Block 322). A switch to the pin 140 in the connector 38 or 40 may open in response to the electrical power 52 exceeding the threshold value (Block 324).

Exemplary embodiments may be physically embodied on or in a computer-readable storage medium. This computer-readable medium may include CD-ROM, DVD, tape, cassette, floppy disk, memory card, USB, and large-capacity disks. This computer-readable medium, or media, could be distributed to end-subscribers, licensees, and assignees. A computer program product comprises processor-executable instructions for monitoring electrical power in the cable assembly 20, as the above paragraphs explained.

While the exemplary embodiments have been described with respect to various features, aspects, and embodiments, those skilled and unskilled in the art will recognize the exemplary embodiments are not so limited. Other variations, modifications, and alternative embodiments may be made without departing from the spirit and scope of the exemplary embodiments.

The invention claimed is:

1. A cable assembly, comprising:
a processor; and
a memory device, the memory device storing instructions, the instructions when executed causing the processor to perform operations, the operations comprising:
conveying data via a connector of the cable assembly;
monitoring electrical power conveyed via the connector of the cable assembly;
comparing the electrical power to a threshold value; and
activating a visual indicator to indicate the electrical power conveyed via the connector exceeds the threshold value.

2. The cable assembly of claim 1, wherein the operations further comprise illuminating the visual indicator.

3. The cable assembly of claim 1, wherein the operations further comprise illuminating the visual indicator to indicate the electrical power conveyed via the connector exceeds the threshold value.

4. The cable assembly of claim 1, wherein the operations further comprise determining a color associated with the visual indicator.

5. The cable assembly of claim 1, wherein the operations further comprise determining a color illuminated by the visual indicator.

6. The cable assembly of claim 1, wherein the operations further comprise serially communicating the data with a host device connected to the connector of the cable assembly.

7. The cable assembly of claim 1, wherein the operations further comprise communicating the data with an accessory device connected to the cable assembly.

8. A cable assembly, comprising:
a processor; and
a memory device, the memory device storing instructions, the instructions when executed causing the processor to perform operations, the operations comprising:
conveying data via a connector of the cable assembly;
monitoring electrical power conveyed via the connector of the cable assembly;
comparing the electrical power to a threshold value; and
activating a visual indicator in the connector of the cable assembly, the visual indicator to indicate the electrical power conveyed via the connector exceeds the threshold value.

9. The cable assembly of claim 8, wherein the operations further comprise selecting a color output by the visual indicator, the color corresponding to the electrical power conveyed via the connector.

10. The cable assembly of claim 8, wherein the operations further comprise illuminating the visual indicator to indicate the electrical power conveyed via the connector exceeds the threshold value.

11. The cable assembly of claim 8, wherein the operations further comprise illuminating the visual indicator to output a color of multiple colors, each one of the multiple colors corresponding to a different value of the electrical power conveyed via the connector.

12. The cable assembly of claim 8, wherein the operations further comprise serially communicating the data with a host device connected to the connector of the cable assembly.

13. The cable assembly of claim 8, wherein the operations further comprise communicating with an accessory device connected to the cable assembly.

14. The cable assembly of claim 8, wherein the operations further comprise isolating an electrical pin in the connector in response to the electrical power exceeding the threshold value.

15. A cable assembly, comprising:
a processor; and
a memory device, the memory device storing instructions, the instructions when executed causing the processor to perform operations, the operations comprising:
receiving data to convey via the cable assembly;
reformatting the data from a first format to a second format required by a device connected to the cable assembly;
monitoring electrical power conveyed via connecting pins of the cable assembly;
comparing the electrical power to a threshold value;
determining the electrical power conveyed via a pin of the connecting pins exceeds the threshold value; and
activating a visual indicator of the cable assembly, the visual indicator to indicate the electrical power conveyed via the pin exceeds the threshold value.

16. The cable assembly of claim 15, wherein the operations further comprise activating a switch in the cable assembly to isolate the pin conveying the electrical power that exceeds the threshold value.

17. The cable assembly of claim 15, wherein the operations further comprise activating a switch of a bank of switches in the cable assembly, the switch activated to isolate the pin conveying the electrical power that exceeds the threshold value.

18. The cable assembly of claim 15, wherein the operations further comprise activating a switch of a bank of switches in the cable assembly, each switch in the bank of switches isolating a different one of the connecting pins, the switch activated to isolate the pin conveying the electrical power that exceeds the threshold value.

19. The cable assembly of claim 15, wherein the operations further comprise:
querying an electronic database for a communications protocol associated with a device connected to the cable assembly, the electronic database stored in the memory device of the cable assembly, the electronic database electronically associating communications protocols to parameters;
identifying a parameter of the parameters in the electronic database that is electronically associated with the communications protocol associated with a device connected to the cable assembly; and
reformatting data received by the cable assembly according to the parameter identified in the electronic database that is electronically associated with the communications protocol associated with the device connected to the cable assembly.

* * * * *